US009441289B2

(12) United States Patent
Fukushima et al.

(10) Patent No.: US 9,441,289 B2
(45) Date of Patent: Sep. 13, 2016

(54) HIGH-PURITY COPPER OR HIGH-PURITY COPPER ALLOY SPUTTERING TARGET, PROCESS FOR MANUFACTURING THE SPUTTERING TARGET, AND HIGH-PURITY COPPER OR HIGH-PURITY COPPER ALLOY SPUTTERED FILM

(75) Inventors: Atsushi Fukushima, Ibaraki (JP); Yuichiro Shindo, Ibaraki (JP); Susumu Shimamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1032 days.

(21) Appl. No.: 13/063,050

(22) PCT Filed: Sep. 24, 2009

(86) PCT No.: PCT/JP2009/066480
§ 371 (c)(1),
(2), (4) Date: Mar. 9, 2011

(87) PCT Pub. No.: WO2010/038642
PCT Pub. Date: Apr. 8, 2010

(65) Prior Publication Data
US 2011/0163447 A1 Jul. 7, 2011

(30) Foreign Application Priority Data
Sep. 30, 2008 (JP) ................... 2008-253052

(51) Int. Cl.
*C22C 9/00* (2006.01)
*C23C 14/34* (2006.01)
*C23C 14/18* (2006.01)
*C23C 14/56* (2006.01)

(52) U.S. Cl.
CPC ............. *C23C 14/3414* (2013.01); *C22C 9/00* (2013.01); *C23C 14/185* (2013.01); *C23C 14/564* (2013.01)

(58) Field of Classification Search
None
See application file for complete search history.

(56) References Cited

U.S. PATENT DOCUMENTS

| | | | | |
|---|---|---|---|---|
| 3,253,910 A * | 5/1966 | Burghoff | ................... | C22C 9/04 420/477 |
| 3,778,318 A * | 12/1973 | Finlay et al. | ............. | C22C 9/00 148/411 |
| 4,537,745 A * | 8/1985 | Hassler | .................... | B22F 3/24 219/121.38 |
| 4,792,369 A | 12/1988 | Ogata et al. | | |
| 4,874,436 A * | 10/1989 | Ogata | ...................... | C22C 9/00 148/404 |
| 5,206,430 A | 4/1993 | Itoh et al. | | |
| 6,197,433 B1 * | 3/2001 | Hatano | .................... | B21B 1/40 148/411 |
| 6,254,702 B1 * | 7/2001 | Hana | ....................... | C22C 9/06 148/433 |
| 6,451,135 B1 | 9/2002 | Takahashi et al. | | |
| 6,896,788 B2 | 5/2005 | Shindo et al. | | |
| 6,908,517 B2 | 6/2005 | Segal et al. | | |
| 6,946,039 B1 | 9/2005 | Segal et al. | | |
| 7,435,325 B2 | 10/2008 | Shindo et al. | | |
| 7,507,304 B2 * | 3/2009 | Okabe et al. | .................. | 148/432 |
| 7,740,721 B2 | 6/2010 | Okabe | | |
| 8,192,596 B2 | 6/2012 | Shindo et al. | | |
| 8,216,442 B2 | 7/2012 | Shindo et al. | | |
| 8,246,764 B2 | 8/2012 | Okabe et al. | | |
| 8,728,255 B2 | 5/2014 | Fukushima et al. | | |
| 2001/0004856 A1 | 6/2001 | Nishi et al. | | |
| 2002/0083571 A1 * | 7/2002 | Lee et al. | ...................... | 29/527.5 |
| 2005/0121320 A1 | 6/2005 | Okabe et al. | | |
| 2005/0161126 A1 * | 7/2005 | Aruga | ....................... | C22C 9/00 148/432 |
| 2005/0236074 A1 * | 10/2005 | Mihara | .................... | C22C 9/06 148/414 |
| 2006/0088436 A1 * | 4/2006 | Okabe | ................. | C23C 14/3414 420/471 |
| 2007/0051624 A1 | 3/2007 | Okabe et al. | | |
| 2007/0148032 A1 * | 6/2007 | Aruga | ....................... | C22C 9/02 420/472 |
| 2008/0025867 A1 * | 1/2008 | Aruga | ....................... | C22C 9/00 420/472 |
| 2008/0047634 A1 * | 2/2008 | Mihara | .................... | C22C 9/06 148/414 |

(Continued)

FOREIGN PATENT DOCUMENTS

CN 1370853 A 9/2002
CN 101199988 A 6/2008

(Continued)

OTHER PUBLICATIONS

Zanner et al. "Vacuum Arc Remelting of Alloy 718", pp. 17-32, 1989.*

(Continued)

Primary Examiner — Kiley Stoner
(74) Attorney, Agent, or Firm — Howson & Howson, LLP

(57) ABSTRACT

Provided is a high-purity copper or high-purity copper alloy sputtering target of which the purity is 6N or higher and in which the content of the respective components of P, S, O and C is 1 ppm or less, wherein the number of nonmetal inclusions having a particle size of 0.5 μm or more and 20 μm or less is 30,000 inclusions/g or less. As a result of using high-purity copper or high-purity copper alloy from which harmful inclusions of P, S, C and O system have been reduced as the raw material and controlling the existence form of nonmetal inclusions, the present invention addresses a reduction in the percent defect of wirings of semiconductor device formed by sputtering a high-purity copper target so as to ensure favorable repeatability.

5 Claims, No Drawings

(56) References Cited

U.S. PATENT DOCUMENTS

| | | | |
|---|---|---|---|
| 2008/0223728 A1* | 9/2008 | Shindo et al. | 205/574 |
| 2009/0004498 A1 | 1/2009 | Shindo et al. | |
| 2009/0010797 A1* | 1/2009 | Aruga | C22C 9/00 420/472 |
| 2009/0101243 A1* | 4/2009 | Aruga | C22C 1/06 148/412 |
| 2009/0140430 A1 | 6/2009 | Okabe et al. | |
| 2009/0162685 A1* | 6/2009 | Kobayashi | C22C 9/06 428/553 |
| 2009/0272466 A1* | 11/2009 | Shindo et al. | 148/432 |
| 2010/0000857 A1* | 1/2010 | Tonogi et al. | 204/192.15 |
| 2010/0013096 A1 | 1/2010 | Irumata et al. | |
| 2010/0163425 A1 | 7/2010 | Shindo et al. | |
| 2010/0219070 A1 | 9/2010 | Okabe | |
| 2011/0123389 A1 | 5/2011 | Shindo et al. | |
| 2013/0302205 A1 | 11/2013 | Shindo et al. | |
| 2014/0010705 A1 | 1/2014 | Kanou | |
| 2014/0097084 A1 | 4/2014 | Nagata et al. | |
| 2014/0110849 A1 | 4/2014 | Otsuki et al. | |
| 2014/0158532 A1 | 6/2014 | Nagata et al. | |

FOREIGN PATENT DOCUMENTS

| | | |
|---|---|---|
| EP | 1247872 A1 | 10/2002 |
| EP | 1903119 A1 * | 3/2008 |
| JP | S61-084389 A | 4/1986 |
| JP | S63-153291 A | 6/1988 |
| JP | 63-297583 A | 12/1988 |
| JP | S64-008289 A | 1/1989 |
| JP | S64-055394 A | 3/1989 |
| JP | 01-152291 A | 6/1989 |
| JP | 02-185990 A | 7/1990 |
| JP | 05-214519 A | 8/1993 |
| JP | 08-108251 A | 4/1996 |
| JP | 09-025564 A | 1/1997 |
| JP | H10-008244 A | 1/1998 |
| JP | 11-106842 A | 4/1999 |
| JP | H11-135461 A | 5/1999 |
| JP | 11-229172 A | 8/1999 |
| JP | H11-315373 A | 11/1999 |
| JP | 2000-107596 A | 4/2000 |
| JP | 2000-239836 A | 9/2000 |
| JP | 2001049369 A * | 2/2001 |
| JP | 2005-307343 A | 11/2005 |
| WO | 01/94659 A2 | 12/2001 |
| WO | 2006/134724 A1 | 12/2006 |

OTHER PUBLICATIONS machine translation of Jp 2001049369 A (no date available).*
S. Fujiwara et al., "Ductility of Ultra High Purity Copper", Journal De Physique IV, Colloque C7, Supplement au Journal de Physique III, vol. 5, pp. C7-295-C7-300, Nov. 1995.
Y. Ishikawa et al., "Floating Zone-Melting of Iron and Copper under Reduced Hydrogen Atmosphere", pp. 10-18, Sep. 1995.
Y. Shindo, "Ultra High Purity Materials", pp. 311-320, Dec. 2006.

* cited by examiner

HIGH-PURITY COPPER OR HIGH-PURITY COPPER ALLOY SPUTTERING TARGET, PROCESS FOR MANUFACTURING THE SPUTTERING TARGET, AND HIGH-PURITY COPPER OR HIGH-PURITY COPPER ALLOY SPUTTERED FILM

BACKGROUND OF THE INVENTION

The present invention relates to a high-purity copper or high-purity copper alloy sputtering target, a process for manufacturing the foregoing sputtering target, and a high-purity copper or high-purity copper alloy sputtered film. Incidentally, "%" and "ppm" as used herein respectively represent "mass %" and "mass ppm". Moreover, "purity" represents the purity excluding C, O, N and H as gas components.

Conventionally, if the aim is to produce a high-purity copper or high-purity copper alloy target, emphasis was primarily placed on eliminating metal elements and non-metal elements, which are recognized as impurities, excluding copper or alloy components, and limiting gas components to a constant amount of several ppm to several hundred ppm.

Thus, trace amounts of inclusions that existed in the high-purity copper or high-purity copper alloy target were not acknowledged as a problem, and no consideration was given for eliminating or reducing the same. Moreover, even in cases where gas components are limited as much as possible, there was no concern with respect to the existence form of the inclusions arising therefrom.

Nevertheless, if there are nonmetal inclusions in the high-purity copper or high-purity copper alloy target, even if they are minute and in trace amounts, protrusions (nodules) would arise on the target surface during the process of forming a thin film by way of sputtering, and particles would arise due to the rupture or the like of the protrusions (nodules) caused by an abnormal discharge. Generation of the foregoing particles causes the percent defective of the semiconductor device to deteriorate.

It was conventionally thought that the other causes had a greater influence on the generation of the foregoing particles, and the recognition of minute and trace amounts of inclusions existing in the high-purity copper or high-purity copper alloy target as the cause was insufficient.

Nevertheless, as the conventionally recognized sources of particles become clarified and subsequently removed, the new recognition is that other sources of particles exist and that it is not possible to realize high quality deposition unless they are removed.

To put it differently, existing sputtering targets for forming copper wiring for use in semiconductors are based on the foregoing sophisticated technology level.

Since the deposition technology of copper wirings for use in semiconductors is well known technology, the principle of deposition based on the sputtering method is briefly explained below.

The sputtering method is to form a film on a substrate by utilizing the phenomenon where atoms configuring the target are discharged into space and accumulated on the opposing substrate based on the momentum exchange that occurs when the accelerated charged particles collide with the target surface.

The sputtering target is usually in the shape of a discoid or rectangular plate, and is used as the sputter source for forming, on the substrate, an electrode, gate, element, insulating film, protective film and the like for various semiconductor devices by way of sputtering.

Generally speaking, as the sputtering target, an aluminum and aluminum alloy target, a copper and copper alloy target, a high-melting-point metal and alloy target, a metal silicide target and the like are used.

Among the foregoing targets, an important target is a copper and copper alloy target that is used in forming a copper wiring as an alternative of a conventional aluminum wiring.

Meanwhile, during the deposition based on sputtering, protrusions having a size of several μm to several mm, referred to as nodules, sometimes arise on the eroded portion of the sputtering target. There is a problem in that such nodules will burst as a result of colliding with the charged particles during the sputtering process, and thereby cause the generation of particles (cluster-state coarse fragments) on the substrate.

The generation of particles will increase in proportion to the amount of nodules on the eroded surface of the target, and a major issue is to prevent the generation of nodules in order to reduce the problematic particles.

Under the recent circumstances where LSI semiconductor devices are subject to higher integration and the linewidth thereof becomes miniaturized to 0.25 μm or less, the generation of particles caused by the foregoing nodules is now being considered a major problem.

Specifically, particles directly adhere to the thin film that is formed on the substrate, or once adhere to and accumulate on the peripheral wall or component of the sputtering device and thereafter flake off and once again adhere to the thin film; and it causes problems such as the disconnection or short circuit of the wiring. The generation of particles is becoming a major problem pursuant to the advancement of higher integration and miniaturization of the electronic device circuit as described above.

As described above, the conventionally recognized sources of particles are being clarified and many have been removed, but the current situation is that it is still insufficient. Unless these other sources of particles are removed, it is not possible to achieve high quality deposition.

Conventional technologies are now introduced. Nevertheless, the following conventional technologies have no concern regarding the shape and influence of the minute and trace amounts of inclusions existing in the high-purity copper, and do not provide any kind of specific solution therefor.

Patent Document 1 describes cleaning electrolyte based on solvent extraction.

Patent Document 2 describes eliminating Sb and Bi with chelate resin.

Patent Document 3 describes adding a diaphragm and glue in copper electrolysis to smooth the electrolyzed surface, and thereby reducing the uptake of impurities.

Patent Document 4 describes bringing anolite into contact with activated carbon in copper electrolysis to eliminate glue.

Patent Document 5 describes performing electrolysis once again in copper electrolysis.

Patent Document 6 describes smoothing the electrode surface based on periodic reverse-current electrolysis in copper electrolysis to prevent the inclusion of suspended solids and electrolyte.

Patent Document 7 describes adding a macromolecular additive to improve the surface condition and using electrolyte containing urea in copper electrolysis to produce high-purity copper with a low silver and sulfur content.

Patent Document 8 describes that the three metallurgical characteristics of a sputtering target affecting the performance of the target are: the uniformity of the material (no precipitate, void, inclusion and other defects); crystal grain size (finer crystal grain size is generally more preferable than coarse crystal grain size); and texture (texture relates to the strength of a specific crystallographic orientation, that is, a "weak" texture includes substantially random distribution of the crystallographic orientation, and a "strong" texture includes a preferential crystallographic orientation in the distribution of the crystallographic orientation). Patent Document 8 further describes that it is generally necessary to reduce defects such as inclusions in the target.

Patent Document 9 discloses a titanium sputtering target in which the number of inclusions of 1 μm or more existing at the crystal grain boundary of titanium configuring the target is 100 inclusions or less per 1 cm$^2$ of the target plane. Patent Document 9 additionally describes that the inclusions existing at the crystal grain boundary of titanium are a composite compound based on a combination of one or more types among oxides, nitrides, carbides, sulfides, and hydrides of metal components of titanium or iron, nickel, chromium, aluminum, silicon, tungsten and molybdenum, and that the oxides can be decomposed by heat treatment.

Patent Document 10 and Patent Document 11 describe that the number of inclusions in an aluminum or aluminum alloy target is reduced to be 40 inclusions/cm$^2$ or less per unit area; splashes can be reduced by bringing the maximum length of the inclusions to 20 μm or less; to reduce the inclusions in the sputtering target is particularly important in order to inhibit the generation of particles and splashes; and inclusions are reduced by filtering molten metal with a ceramic filter.

Patent Document 12 discloses a high-purity copper or copper alloy sputtering target, wherein the target has an oxygen content of 100 ppm or less, a carbon content of 150 ppm or less, a nitrogen content of 50 ppm or less, and a sulfur content of 200 ppm or less, or the number of indications having a flat-bottomed hole diameter of 0.5 mm or more is 0.014 indications/cm$^2$ or less on an ultrasonic inspection performed from the target surface; and a process for manufacturing a high-purity copper or copper alloy sputtering target having an oxygen content of 100 ppm or less, a carbon content of 150 ppm or less, a nitrogen content of 50 ppm or less, and a sulfur content of 200 ppm or less, wherein used is a high-purity copper or copper alloy ingot obtained by melting and casting based on electron beam melting or vacuum induction skull melting. However, inclusions large enough to be detected on the ultrasonic inspection are not observed in current high-purity copper targets.

Patent Document 13 describes that oxygen, nitrogen and carbon as gas components contained in the copper alloy sputtering target form inclusions at the crystal grain boundary and cause the generation of particles, and that it is desirable to reduce such gas components as much as possible since they cause the unexpected generation of particles during the sputter life. Patent Document 13 also describes that unavoidable impurities excluding gas components are reduced to 10 wtppm or less.

[Patent Document 1]
Japanese Laid-Open Patent Publication No. H11-106842
[Patent Document 2]
Japanese Laid-Open Patent Publication No. 2000-107596
[Patent Document 3]
Japanese Laid-Open Patent Publication No. S63-297583
[Patent Document 4]
Japanese Laid-Open Patent Publication No. S64-55394
[Patent Document 5]
Japanese Laid-Open Patent Publication No. H1-152291
[Patent Document 6]
Japanese Laid-Open Patent Publication No. S64-8289
[Patent Document 7]
Japanese Laid-Open Patent Publication No. 2005-307343
[Patent Document 8]
Japanese Laid-Open Patent Publication No. 2004-513228
[Patent Document 9]
Japanese Laid-Open Patent Publication No. H5-214519
[Patent Document 10]
Japanese Laid-Open Patent Publication No. H9-25564
[Patent Document 11]
Japanese Laid-Open Patent Publication No. H11-315373
[Patent Document 12]
Japanese Laid-Open Patent Publication No. 2000-239836
[Patent Document 13]
WO2004/083482

SUMMARY OF THE INVENTION

Accordingly, the purity and structure of the target must be improved in order to inhibit the generation of particles and, needless to say, the raw material itself must be of high purity. Thus, although the selection of the raw material is important, there is a high possibility of incorporation of impurities during the process of producing the target.

Nonmetal inclusions exist even in a high-purity copper target having a purity level of 6N or even 7N. Nonmetal inclusions of oxide system such as alumina and magnesia were generally considered as the harmful impurities. These elements need to be reduced as a matter of course, but it has been discovered that, rather than the foregoing oxide system inclusions, carbon system inclusions particularly have an adverse effect in the process of producing copper wirings (especially those which are 0.18 μm or less) of semiconductor devices. These inclusions get mixed as particles in the film that is formed by sputtering the target containing the foregoing nonmetal inclusions.

Even if oxide system inclusions get mixed as particles in the film that is formed by sputtering, since they have large electrical resistance in comparison to copper, it is possible to detect the defective portions during the inspection process that is performed midway in the production, and block and eliminate the wiring of the area containing such defects.

But unlike the foregoing oxide system inclusions, the carbon system inclusions (especially graphite) are more likely to have an adverse effect. The reason for this is because, for instance, if graphite is incorporated as particles in the film that is formed by sputtering, since it has low electrical resistance, it is difficult to detect the wiring portion containing the particles, and it may not be possible to detect such particles as defects. Thus, conventionally, measures were not taken for eliminating such carbon system inclusions (especially graphite) in advance.

Moreover, although the oxide system inclusions can be easily eliminated with CMP (Chemical Mechanical Polishing) during the process of forming the wiring after deposition, since carbon system inclusions (especially graphite) are chemically stable, they tend to remain without being eliminated and become a nuisance once they are incorporated in the film.

Here, in cases where defects, which could not be detected in the inspection based on the electrical resistance, occurred frequently in the film formed by sputtering; the used target was checked. As a result of analysis using a liquid particle counter, even though it was a high-purity copper target having a purity of 6N and a carbon content of 1 ppm or less, nonmetal inclusions having a particle size of 0.5 μm or more and 20 μm or less were detected in a quantity of approximately 60,000 inclusions/g in the target structure.

Moreover, as a result of performing electrolytic etching to this high-purity copper target and analyzing the protrusive inclusions that appear on the surface using FIB-AES, it was discovered that approximately half were carbon system inclusions.

The foregoing nonmetal inclusions or the carbon system inclusions of carbon or carbide were measured with the "light scattering automatic particle counter for liquid" (manufactured by Kyushu RION Corporation). The measurement method is based on sorting the particle size in the liquid and measuring the particle concentration and particle count. The foregoing measuring equipment is also known as a "liquid particle counter" and is based on JIS B 9925 (this measuring equipment is hereinafter referred to as the "liquid particle counter").

To explain the specific measurement method, 5 g of the target structure were sampled and slowly dissolved in 200 c of acid so that the inclusions will not be dissolved, it is diluted with deionized water to be 500 cc, and 10 cc of this was taken and measured with the liquid particle counter. For example, if the number of inclusions is 800 inclusions/cc, this means that 0.1 g of the sample was analyzed in 10 cc, and the number of inclusions will be 8000 inclusions/g.

The number of nonmetal inclusions or the carbon system inclusions of carbon or carbide was measured with the liquid particle counter as described above. However, it should be easily understood that there is no particular problem in using other means if similar analysis of the number of inclusions can be performed.

It has been considered that the foregoing carbon system inclusions are incorporated mainly from the graphite that is used as the crucible upon performing vacuum melting such as VIM. However, even when a material having higher density in comparison to the conventional materials of the graphite crucible, or a material having orientation, or a crucible of which the surface is coated with amorphous carbon was used; a lasting effect could not be achieved and, contrarily, there were cases where numerous inclusions would be unexpectedly incorporated.

In light of the above, an object of the present invention is to reduce the percent defect of wirings of semiconductor device during sputter deposition so as to ensure favorable repeatability, as a result of using high-purity copper or high-purity copper alloy from which harmful inclusions of P, S, C and O system have been reduced as the raw material, controlling the existence form of nonmetal inclusions in the raw material, in particular reducing carbon system inclusions, and thereby improving the purity and the structure of the high-purity copper or high-purity copper alloy target itself.

As a result of intense study to achieve the foregoing object, the present inventors made the following discovery. Specifically, the present inventors discovered that it is possible to reduce the percent defective of wirings of semiconductor device that were formed by sputtering a high-purity copper or high-purity copper alloy target, as a result of reducing the abundance of nonmetal inclusions having a particle size of 0.5 μm or more and 20 μm or less in high-purity copper and high-purity copper alloy, and additionally reducing carbon system inclusions.

Based on the foregoing discoveries, the present invention provides:

1) A high-purity copper or high-purity copper alloy sputtering target of which the purity is 6N or higher and in which the content of the respective components of P, S, O and C is 1 ppm or less, wherein the number of nonmetal inclusions having a particle size of 0.5 μm or more and 20 μm or less is 30,000 inclusions/g or less;

2) The high-purity copper or high-purity copper alloy sputtering target according to 1) above, wherein the number of nonmetal inclusions having a particle size of 0.5 μm or more and 20 μm or less is 15,000 inclusions/g or less;

3) The high-purity copper or high-purity copper alloy sputtering target according to 1) above, wherein the number of inclusions of carbon or carbide having a particle size of 0.5 μm or more and 20 μm or less is 15,000 inclusions/g or less; and 4) The high-purity copper or high-purity copper alloy sputtering target according to any one of 1) to 3) above, wherein the proportion of carbon or carbide in the nonmetal inclusions is 50% or less.

The present invention additionally provides:

5) A process for manufacturing a high-purity copper sputtering target, wherein high-purity copper or high-purity copper alloy of which the purity is 6N or higher and in which the content of the respective components of P, S, O and C is 1 ppm or less and the number of nonmetal inclusions having a particle size of 0.5 μm or more and 20 μm or less is 30,000 inclusions/g or less is used as a raw material, and the raw material is melted through a cold crucible melting process or a vacuum arc remelting process to achieve a purity of 6N or higher and a carbon content of 1 ppm or less and to bring the number of nonmetal inclusions having a particle size of 0.5 μm or more and 20 μm or less to 30,000 inclusions/g or less;

6) A process for manufacturing a high-purity copper alloy sputtering target, wherein the high-purity copper of 5) above is used as a raw material, and the mixture produced by adding an alloy component to the raw material is melted through a cold crucible melting process or a vacuum arc remelting process to achieve a purity of 6N or higher and a carbon content of 1 ppm or less and to bring the number of nonmetal inclusions having a particle size of 0.5 μm or more and 20 μm or less to 30,000 inclusions/g or less;

7) The process for manufacturing a high-purity copper or high-purity copper alloy sputtering target according to 5) or 6) above, wherein nonmetal inclusions having a particle size of 0.5 μm or more and 20 μm or less are reduced to 15,000 inclusions/g or less;

8) The process for manufacturing a high-purity copper or high-purity copper alloy sputtering target according to any one of 5) to 7) above, wherein inclusions of carbon or carbide having a particle size of 0.5 μm or more and 20 μm or less are reduced to 15,000 inclusions/g or less; and 9) The process for manufacturing a high-purity copper or high-purity copper alloy sputtering target according to any one of 5) to 8) above, wherein the proportion of carbon or carbide in the nonmetal inclusions is 50% or less.

The present invention also provides:

10) A high-purity copper or high-purity copper alloy sputtered film, wherein the number of carbon or carbide particles having a particle size of 0.05 μm or more is 10 particles/square inch or less;

11) The high-purity copper or high-purity copper alloy sputtered film according to 10) above, wherein the number of carbon or carbide particles having a particle size of 0.05 μm or more is 5 particles/square inch or less; and 12) A semiconductor device having the high-purity copper or high-purity copper alloy sputtered film according to 10) or 11) above as a copper wiring.

Accordingly, as a result of using high-purity copper or high-purity copper alloy from which harmful inclusions of P, S, C and O system have been reduced as the raw material and controlling the existence form of nonmetal inclusions, it is possible to inhibit the generation of particles when sputtering a high-purity copper or high-purity copper target, and a superior effect of being able to reduce the percent defective of wirings of semiconductor device is yielded.

DETAILED DESCRIPTION OF THE INVENTION

P, S, O and C are particularly problematic as impurities that cause the generation of inclusions. Since the solubility of these elements in copper is extremely low, many of these become inclusions in copper. Particularly in achieving a high-purity copper of the present invention, it is a taboo to add organic additives such as glue or polymer for smoothing or the like as is conventionally done. This is because the addition of such additives will increase the existence of P, S, O and C.

Moreover, electrolyte of a sulfuric acid system that particularly causes incorporation of nonmetal inclusions, in particular S, was not used, and electrolyte of nitric acid or hydrochloric acid system was used. Nevertheless, even when taking the foregoing measures, the inclusion of large amounts of P, S, O and C as impurities was acknowledged. Thus, it was necessary to seek the cause of increase in impurities elsewhere; that is, other than the increase due to electrolyte itself.

Thus, as a result of investigating the source of inclusions, it has been confirmed that $SiO_2$, C (carbon and carbide), and $AS_2O_3$ may be incorporated by: elution of organics from electrolytic device, particularly pipes or the like for supplying and circulating the electrolyte, into the electrolyte during electrolytic refining; circumstances in which the electrolytic device is placed; and the adhesion to the anode.

Moreover, P, S and O contained in the electrolyte exist as the suspended solids of CuP, CuS and CuO, and it has also been discovered that these suspended solids are sometimes caught in the copper during the electrolysis at the cathode, and that these suspended solids are the primary cause of contamination.

In particular, in cases where the impurities are organics, if the electrolytic copper containing organics of several ppm or more in a high concentration is to be melted by way of high frequency melting in order to achieve high purity, carbon (C) that is formed as a result of the decomposition of the organics will be incorporated in the melted copper as is, or as carbide.

In light of the above, it is important to avoid adding additives to the electrolyte, separate the cathode and the anode with a diaphragm, and pass the electrolyte through an activated carbon filter immediately before supplying the electrolyte to the cathode in order to eliminate the organics and suspended solids, and it has been discovered that the foregoing process is effective in reducing inclusions.

There are $SiO_2$, C, $Al_2O_3$, CuP, CuS, CuO and the like as the foregoing impurities, but CuP, CuS and CuO are copper compounds that hardly become a solid solution in Cu. Meanwhile, solids of C system (graphite and carbide), $SiO_2$ and $Al_2O_3$ exist as dust, and these exist as solids in the copper structure.

The term "nonmetal inclusions" as used in this specification refers to the solids existing in the copper structure. Once these solids are incorporated, they cannot be sufficiently eliminated in the melting process.

Among the above, carbon or carbide having carbon as its component is particularly harmful as described above. When carbon or carbide is incorporated during the semiconductor production process, it becomes extremely difficult to eliminate such carbon or carbide. These impurities cause defects in the semiconductor equipment and become even a greater problem pursuant to the miniaturization of such semiconductor equipment.

In light of the above, in cases of producing high-purity copper based on electrolytic refining, an important process for eliminating impurities on a raw material level is to provide a diaphragm between the anode and the cathode and pass the electrolyte extracted from the anode-side electrolytic cell (anode box) or the additional electrolyte through an activated carbon filter immediately before supplying such electrolyte to the cathode-side electrolytic cell (cathode box), and thereafter to supply the electrolyte to cathode-side electrolytic cell in order to perform electrolytic refining.

In the foregoing case, if a standard polypropylene filter is used, for example, the inclusions cannot be eliminated. Specifically, this means that the elimination of inclusions will be difficult depending on the type of filter. Moreover, if the electrolyte is supplied from the anode box to the cathode box through a pipe or a pump, the reduction of inclusions is similarly difficult.

This is because the use of a pipe or a pump in itself becomes the contamination source. Although these may seem to be simple processes, utmost attention must also be given even in the foregoing electrolytic refining process in order to prevent the deterioration of characteristics caused by the incorporation of trace amounts of minute nonmetal inclusions.

The electrolytic production process for producing the high-purity copper was described above, and the high-purity copper of the present invention can only be obtained with the foregoing process. As the starting material, a commercially available high-purity copper material having a purity level of 5N or less can be used. Nevertheless, this starting material contains metal components other than Cu, nonmetal components ($SiO_2$, $Al_2O_3$ and so on), P, S, O, C and their compounds (CuP, CuS, CuO and so on) each in the amount of several ppm to several thousand ppm.

Although the high-purity copper of the present invention uses the foregoing starting material as the raw material; it is desirable to yield a high-purity copper of which the purity is 6N or higher and in which the content of the respective components of P, S, O and C is 1 ppm or less and the number of nonmetal inclusions having a particle size of 0.5 μm or more and 20 μm or less is 10,000 inclusions/g or less, more preferably 5,000 inclusions/g or less.

The components of P, S, O and C all become impurities in copper and form phosphides, sulfides, carbides and oxides that do not become a solid solution in the copper, and these may cause the formation of nonmetal inclusions. Thus, by achieving these components of 1 ppm or less respectively, the nonmetal inclusions can be reduced and the characteristics of high-purity copper can improve.

The high-purity copper produced as described above is used to prepare a target.

The present invention is to bring the number of nonmetal inclusions having a particle size of 0.5 μm or more and 20 μm or less contained in the high-purity copper or high-purity copper alloy sputtering target to 30,000 inclusions/g or less, and the volume of such nonmetal inclusions is the problem. If the number of nonmetal inclusions in the high-purity copper or high-purity copper alloy as the raw material exceeds 10,000 inclusions/g, the nonmetal inclusions in the target will reach a level of becoming problematic and become protrusive foreign matter during the erosion of the target, and abnormal discharge is easily generated at such protrustive foreign matter. This causes the generation of particles during sputtering.

With nonmetal inclusions having a particle size of 0.5 µm or more and 20 µm or less in a sputtering target, the value of 30,000 inclusions/g or less is not necessarily a large amount. This value cannot be achieved simply by reducing the content of impurities configuring the nonmetal inclusions to be 1 ppm or less. Preferably, the number of nonmetal inclusions having a particle size of 0.5 µm or more and 20 µm or less is 15,000 inclusions/g or less.

Nevertheless, this is important in order to reduce the percent defective of wirings of semiconductor device that are formed by sputtering a high-purity copper target. It is necessary to recognize the importance of this fact as the latest technology.

In particular, the existence of inclusions of carbon or carbide is harmful, and it is desirable to reduce the nonmetal inclusions containing carbon or carbide having a particle size of 0.5 µm or more and 20 µm or less to 15,000 inclusions/g or less. It is more preferable to reduce such inclusions to 10,000 inclusions/g or less, and even more preferable to reduce those to 5,000 inclusions/g or less so that it will be 50% or less of the overall nonmetal inclusions. Since the carbon or carbide is often contaminated from organics as described above, the use of organics in electrolytic refining must be avoided.

A high-purity copper alloy sputtering target can be produced by additionally adding an alloy element to the foregoing high-purity copper as the base material.

Although there is no particular limitation as the alloy element, for example, the sputtering target may be produced by adding one type or two types or more among the normally added elements of Al, Ag, B, Cr, Ge, Mg, Mn, Nd, Si, Sn, Ti and Zr to the high-purity copper at a rate of 10% or less.

Commercially available high-purity copper materials and the aforementioned alloy component materials may be used as the raw material of the high-purity copper or high-purity copper alloy to be used in producing the sputtering target of the present invention. However, it is necessary to reduce, from the raw material itself, the impurity content of radioactive elements, alkali metals, transition metals, heavy metals and the like which have an adverse effect on electronic devices or the like as much as possible.

In particular, with semiconductor equipment, radioactive elements such as U and Th as impurities affect the MOS with their radiation, alkali metals and alkali earth metals such as Na and K deteriorate the MOS interface characteristics, and transition metals or heavy metals such as Fe, Ni and Co generate an interface state or cause a junction leak. These elements may contaminate the semiconductor equipment through the copper film.

In light of the above, it is desirable to reduce the total amount of alkali metals and alkali earth metals to be 5 ppm or less, the total amount of radioactive elements to be 1 ppb or less, and the total amount of heavy metals and light metals contained as impurities other than the alloy elements to be 10 ppm or less.

A target is usually prepared by melting and casting the raw material, performing plastic forming processes such as forging and rolling as well as heat treatment in order to achieve the appropriate crystal structure, particle size and the like of the cast material, and performing finish processing to obtain the final target size in a discoid shape or the like. In addition, the quality of the target such as its crystal orientation can be controlled by appropriately combining the plastic forming process such as forging and rolling, and the heat treatment process.

The primary inclusions in the copper and copper alloy are oxides, nitrides, carbides and sulfides, and they are generated during the process of melting and casting the raw material. Thus, melting and casting are performed in a nonoxidizing atmosphere, or preferably in a vacuum for efficiently eliminating oxygen, nitrogen and sulfur as the inclusion sources.

In addition, as the melting method, electron beam melting using a water-cooled copper crucible, vacuum induction skull melting, or the use of a water-cooled copper mold is suitable in order to avoid the contamination of carbon and oxygen from the graphite crucible that is used in conventional high frequency melting.

With the vacuum arc remelting process, it is preferable to use the high-purity copper as the electrode, and it is further preferable to use high-purity copper with as few inclusions as the melted raw material. Moreover, with the cold crucible melting process, it is also effective to add the arc melting function of using the high-purity copper as the electrode in order to assist the melting process.

When a copper alloy target is to be prepared, an additive element to obtain the alloy is added at this melting stage in order to achieve the intended copper alloy.

When the copper or copper alloy target from which the foregoing impurities and inclusions were reduced is used for sputtering, the reduction of impurities and inclusions of the target is reflected in the thin film, and a thin film having the same inclusion level of impurities and inclusions as the target can be obtained.

EXAMPLES

The Examples and Comparative Examples of the present invention are now explained. These Examples are merely illustrative, and the present invention shall in no way be limited thereby. In other words, various modifications and other embodiments based on the technical spirit claimed in the claims shall be included in the present invention as a matter of course.

(Preparation of Target Raw Material)

As the target raw material, preferably used is high-purity copper of which the purity is 6N or higher and in which the content of the respective components of P, S, O and C is 1 ppm or less and the number of nonmetal inclusions having a particle size of 0.5 µm or more and 20 µm or less is 10,000 inclusions/g or less.

In order to produce this high-purity copper, 4N—Cu was used as the raw material anode and electrolytic refining was performed using electrolyte of nitric acid series. Here, electrolysis was performed by separating the cathode and the anode with a diaphragm, extracting the Cu ion-containing electrolyte that was eluted from the anode, and passing it through an activated carbon filter immediately before being put into the cathode box.

As a result of measuring the obtained electrodeposited copper with a liquid particle counter, the number of detected nonmetal inclusions having a particle size of 0.5 µm or more and 20 µm or less was 8,000 inclusions/g. In addition, the contents of P, S, O and C in the electrodeposited copper were 1 ppm or less respectively.

As described above, at the stage of preparing the raw material, it is possible to produce high-purity copper of which the purity is 6N or higher and in which the content of the respective components of P, S, O and C is 1 ppm or less and the number of nonmetal inclusions having a particle size of 0.5 μm or more and 20 μm or less is 10,000 inclusions/g or less.

Incidentally, in the case where a standard polypropylene filter (filteration accuracy of 0.5 μm) was used as the filter, the case where the Cu ion-containing electrolyte that was eluted from the anode was extracted and put into the cathode box without passing it through a filter, and the case where an activated carbon filter is disposed immediately after the anode box and the electrolyte is passed therethrough and returned to the cathode box via a pipe and a pump; none of the foregoing cases were able to achieve the intended purity of the raw material. In this respect, it is necessary to produce high-purity copper even during the preparation of the raw material.

Example 1

The foregoing raw material from which organic inclusions were reduced by additionally performing an electrolytic process to electrolytic copper having a purity of 6N, namely high-purity copper of which the purity is 6N or higher and in which the content of the respective components of P, S, O and C is 1 ppm or less and the number of nonmetal inclusions having a particle size of 0.5 μm or more and 20 μm or less measured with a liquid particle counter is 8,000 inclusions/g or less, was used.

50 kg of the raw material was subject to cold crucible melting to obtain an ingot, further subject to the processes of homogenization heat treatment, forging, rolling, and heat treatment to produce a sputtering target. Conventional methods may be used as the processes of homogenization heat treatment, forging, rolling, and heat treatment of the target.

As a result of measuring this target with a liquid particle counter, the number of nonmetal inclusions having a particle size of 0.5 μm or more and 20 μm or less was 20,000 inclusions/g. As a result of performing electrolytic etching to this target and analyzing the protrusive nonmetal inclusions that appeared on the surface using FIB-AES, 40% was inclusions of the carbon system (including carbon and carbide).

Specifically, the number of carbon system inclusions having a particle size of 0.5 μm or more and 20 μm or less was 8000 inclusions/g. As a result of sputtering this target to deposit a copper thin film on a 300 mm wafer, the number of particles having a particle size of 0.05 μm or more was 17 particles/square inch. Among the above, the number of carbon system particles having a particle size of 0.05 μm or more was small at 10 particles/square inch, and a favorable sputtered film was obtained.

Example 2

50 kg of the same raw material as Example 1 was subject to a combination of cold crucible melting and vacuum induction melting to prepare an ingot, and similarly subject to the processes of homogenization heat treatment, forging, rolling, and heat treatment to produce a sputtering target.

As a result of measuring this target with a liquid particle counter, the number of nonmetal inclusions having a particle size of 0.5 μm or more and 20 μm or less was 10,000 inclusions/g.

As a result of performing electrolytic etching to this target and analyzing the protrusive inclusions that appeared on the surface using FIB-AES, 30% was inclusions composed mostly of the carbon system (including carbon and carbide). Specifically, the number of carbon system inclusions having a particle size of 0.5 μm or more and 20 μm or less was 3000 inclusions/g.

As a result of sputtering this target to deposit a copper thin film on a 300 mm wafer, the number of particles having a particle size of 0.05 μm or more was 8 particles/square inch. Among the above, the number of carbon system particles having a particle size of 0.05 μm or more was small at 4 particles/square inch, and a favorable sputtered film was obtained.

Comparative Example 1

50 kg of the same raw material as Example 1 was melted by way of vacuum induction melting using a high-purity and high-density graphite crucible to prepare an ingot. As with the Examples, the ingot was subject to the processes of homogenization heat treatment, forging, rolling, and heat treatment to produce a sputtering target. The number of nonmetal inclusions having a particle size of 0.5 μm or more and 20 μm or less was large at 40,000 inclusions/g.

As a result of performing electrolytic etching to this target and analyzing the protrusive inclusions that appeared on the surface using FIB-AES, 80% was inclusions composed mostly of carbon. Specifically, the number of carbon system inclusions having a particle size of 0.5 μm or more and 20 μm or less was 30,000 inclusions/g and more.

As a result of sputtering this target to deposit a copper thin film on a 300 mm wafer, the number of particles having a particle size of 0.05 μm or more was 80 particles/square inch. In addition, the number of carbon system particles having a particle size of 0.05 μm or more was 60 particles/square inch.

Provided is a high-purity copper or high-purity copper alloy from which harmful inclusions of P, S, C and O system have been reduced. As a result of controlling the existence form and amount of nonmetal inclusions, especially controlling the existence form and amount of carbon system inclusions; it is possible to inhibit the generation of particles when sputtering a high-purity copper or high-purity copper target, and obtain a superior effect of being able to reduce the percent defective of the wirings of semiconductor device.

Accordingly, under the recent circumstances where LSI semiconductor devices are subject to higher integration and the linewidth thereof becomes miniaturized to 0.25 μm or less, the present invention is effective as a high-purity copper and copper alloy target suitable for forming a copper wiring or the like that is capable of preventing problems such as short circuits and disconnections.

The invention claimed is:

1. A process for manufacturing a high-purity copper or high-purity copper alloy sputtering target, comprising the steps of:
   providing a high purity copper anode and an aqueous nitric acid or hydrochloric acid solution as an electrolyte in an electrolytic cell for an electrolytic refining process, wherein an anode side of the electrolytic cell is separated from a cathode side with a diaphragm;
   performing electrolysis in the electrolytic cell, extracting anolyte formed by the electrolysis, and filtering the extracted anolyte through an activated carbon filter immediately before supplying the filtered anolyte to the cathode side;

obtaining a high purity electrodeposited copper on the cathode as a raw material having a purity of 6N or higher, a content of 1 ppm or less of each of P, S, O and C impurity elements, and a structure containing nonmetal inclusions dispersed therein of a number of 30,000 inclusions/g or less for nonmetal inclusions having a size of 0.5 to 20 μm; and melting the high purity electrodeposited copper with a cold crucible melting process or a vacuum arc remelting process and casting the molten copper to obtain a cast ingot of copper having a purity of 6N or higher, a content of 1 ppm or less for each of P, S, O and C impurity elements, and a structure containing nonmetal inclusions dispersed therein of a number of 30,000 inclusions/g or less for nonmetal inclusions having a size of 0.5 to 20 μm; or melting the high purity electrodeposited copper with addition of at least one alloying element in a cold crucible melting process or a vacuum arc remelting process and casting the molten copper alloy to obtain a cast ingot of the high-purity copper alloy having a purity of a purity of 6N or higher, a content of 1 ppm or less for each of P, S, O and C impurity elements, and a structure containing nonmetal inclusions dispersed therein of a number of 30,000 inclusions/g or less for nonmetal inclusions having a size of 0.5 to 20 μm.

2. The process for manufacturing a high-purity copper or high-purity copper alloy sputtering target according to claim 1, wherein the nonmetal inclusions having a size of 0.5 to 20 μm in the high purity electrodeposited copper and the ingot of copper or copper alloy are 15,000 inclusions/g or less.

3. The process for manufacturing a high-purity copper or high-purity copper alloy sputtering target according to claim 1, wherein inclusions of carbon or carbide having a particle size of 0.5 to 20 μm in the high purity electrodeposited copper and the ingot of copper or copper alloy are 15,000 inclusions/g or less.

4. The process for manufacturing a high-purity copper or high-purity copper alloy sputtering target according to claim 3, wherein the proportion of carbon or carbide in the nonmetal inclusions is 50% or less.

5. The process for manufacturing a high-purity copper or high-purity copper alloy sputtering target according to claim 1, wherein the proportion of carbon or carbide in the nonmetal inclusions is 50% or less.

* * * * *